US011004857B1

(12) United States Patent
Wu et al.

(10) Patent No.: US 11,004,857 B1
(45) Date of Patent: May 11, 2021

(54) OPERATING METHOD OF AN ELECTRICALLY ERASABLE PROGRAMMABLE READ ONLY MEMORY (EEPROM) CELL

(71) Applicant: YIELD MICROELECTRONICS CORP., Chu-Pei (TW)

(72) Inventors: Cheng-Ying Wu, Chu-Pei (TW); Cheng-Yu Chung, Chu-Pei (TW); Wen-Chien Huang, Chu-Pei (TW)

(73) Assignee: Yield Microelectronics Corp., Chu-Pei (TW)

( * ) Notice: Subject to any disclaimer, the term of this patent is extended or adjusted under 35 U.S.C. 154(b) by 12 days.

(21) Appl. No.: 16/747,787

(22) Filed: Jan. 21, 2020

(30) Foreign Application Priority Data

Nov. 29, 2019 (TW) .................................. 108143601

(51) Int. Cl.
*G11C 11/00* (2006.01)
*G11C 16/12* (2006.01)
(Continued)

(52) U.S. Cl.
CPC .... *H01L 27/11521* (2013.01); *G11C 16/0433* (2013.01); *G11C 16/10* (2013.01); *G11C 16/14* (2013.01); *H01L 29/0847* (2013.01)

(58) Field of Classification Search
CPC ..... G11C 16/0416; G11C 16/14; G11C 16/10; G11C 16/0475; G11C 16/16; G11C 16/12; G11C 16/24; G11C 8/14; G11C 15/04
See application file for complete search history.

(56) References Cited

U.S. PATENT DOCUMENTS 5,376,572 A    12/1994   Yang et al.
5,487,034 A *    1/1996   Inoue .................... G11C 16/02
                                                      365/185.16
(Continued)

FOREIGN PATENT DOCUMENTS

DE          4404270 A1    9/1994
TW       201639159 A    11/2016
(Continued)

OTHER PUBLICATIONS

Communication From the Taiwan Patent Office dated (Taiwan Year 109) dated Jun. 3, 2020.

*Primary Examiner* — Hien N Nguyen
(74) *Attorney, Agent, or Firm* — Rosenberg, Klein & Lee (57) ABSTRACT

An operating method of an EEPROM cell is provided. The EEPROM cell comprises a transistor structure disposed on a semiconductor substrate and the transistor structure comprises a first electric-conduction gate. The-same-type ions are implanted into the semiconductor substrate between an interface of its source, drain and the first electric-conduction gate, or into the ion doped regions of the source and the drain, so as to increase ion concentrations in the implanted regions and reduce voltage difference in writing and erasing operations. The operating method of the EEPROM cell provides an operating condition that the drain or the source is set as floating during operations, to achieve the objective of rapid writing and erasing of a large number of memory cells. The proposed operating method is also applicable to the EEPROM cell having a floating gate structure in addition to a single gate transistor structure.

17 Claims, 5 Drawing Sheets

(51) Int. Cl.
*H01L 27/11521* (2017.01)
*G11C 16/04* (2006.01)
*H01L 29/08* (2006.01)
*G11C 16/14* (2006.01)
*G11C 16/10* (2006.01)

(56) References Cited

U.S. PATENT DOCUMENTS

| | | | | |
|---|---|---|---|---|
| 5,687,113 | A * | 11/1997 | Papadas | G11C 11/5621 |
| | | | | 257/E21.422 |
| 6,356,480 | B1 | 3/2002 | Sakakibara et al. | |
| 6,466,484 | B1 | 10/2002 | Sakakibara et al. | |
| 9,240,242 | B1 * | 1/2016 | Lin | G11C 16/24 |
| 2016/0379712 | A1 * | 12/2016 | Lin | G11C 16/0433 |
| | | | | 365/185.29 |
| 2019/0088330 | A1 * | 3/2019 | Lin | G11C 16/14 |
| 2020/0327944 | A1 * | 10/2020 | Lin | H01L 29/42324 |

FOREIGN PATENT DOCUMENTS

| | | |
|---|---|---|
| TW | 201714182 A | 4/2017 |
| TW | 201717207 A | 5/2017 |
| TW | 201820592 A | 6/2018 |
| TW | 201911306 A | 3/2019 |
| TW | 201911541 A | 3/2019 |

* cited by examiner

OPERATING METHOD OF AN ELECTRICALLY ERASABLE PROGRAMMABLE READ ONLY MEMORY (EEPROM) CELL

This application claims priority for Taiwan patent application no. 108143601 filed on Nov. 29, 2019, the content of which is incorporated by reference in its entirely.

BACKGROUND OF THE INVENTION

1. Field of the Invention

The present invention is related to an electrically erasable programmable read only memory (EEPROM) technology, and more particularly to methods for rapidly programming and erasing of an EEPROM (Electrically Erasable Programmable Read Only Memory) cell.

2. Description of the Related Art

As the blooming development of computer information products, a non-volatile memory, such as electrically erasable programmable read only memory (EEPROM) or flash memory, has been widely utilized as a semiconductor storage device that is programmable for multiple times by electronic means. It only requires a specific voltage to erase the data stored in the non-volatile memory first so the new data can be written-in. In addition, the data will not disappear even after the power is turn off. As a result, the non-volatile memory has been known as being widely used in various electronic products.

Non-volatile memories are programmable, and are able to adjust gate voltages of their transistors by storing charges, or to preserve the original gate voltages of transistors by not storing charges. When regarding to erase a non-volatile memory, the charges stored in the non-volatile memory are removed to resume the initial state of the memory, and return to its original gate voltages of the transistors. As regarding the existing non-volatile memories, it is well known that a high voltage difference is inevitably required for the erasing operation. However, it draws high attention that such process always increases area consuming and process complexity of the nonvolatile memory.

Therefore, based on the prior arts as discussed above, it should be apparent and obvious that there is indeed an urgent need for the professionals in the field for a novel and inventive electrically erasable programmable read only memory (EEPROM) cell to be developed, which can be operated under low currents and low voltage differences, and effectively solve the above mentioned problems occurring in the prior design. In addition, a low-voltage and rapid operating method of such EEPROM cell is proposed accordingly.

SUMMARY OF THE INVENTION

A major objective of the present invention is to provide an operating method of an EEPROM cell. For the EEPROM cell, ion implantation for increasing ion concentration is employed to enhance electric field between the gate and the transistor or between the gate and the substrate, so as to reduce a voltage difference in writing and erasing operations. Furthermore, the present invention provides an operating condition that the source or the drain can be set as floating during operations, so as to achieve the objectives of rapid programming and erasing for a large number of memory cells.

In order to achieve the objective, the present invention provides an operating method of an EEPROM cell, and the EEPROM cell comprises a semiconductor substrate and at least one transistor structure disposed on the semiconductor substrate. The transistor structure comprises a first dielectric layer disposed on a surface of the semiconductor substrate, a first electric-conduction gate disposed on the first dielectric layer, and at least two first ion doped regions disposed in the semiconductor substrate and on two opposite sides of the first electric-conduction gate for serving as a source and a drain, respectively. Ion implantation manners are used to implant the-same-type ions, in the semiconductor substrate, which is between an interface of the source, the drain and the first electric-conduction gate, or in the first ion doped regions, so as to increase ion concentrations, thereby reducing a voltage difference in writing and erasing operations.

In addition to the application of the aforementioned single gate transistor structure, the operating method of the present invention is also applicable to a floating gate structure. In such embodiment, besides the aforementioned transistor structure, the EEPROM cell further comprises a capacitor structure disposed on a surface of the semiconductor substrate and separated from the transistor structure. The capacitor structure comprises a second ion doped region disposed in the semiconductor substrate, a second dielectric layer disposed on a surface of the second ion doped region, and a second electric-conduction gate stacked on the second dielectric layer, which is electrically connected to the first electric-conduction gate, and serving as a floating gate.

According to above-mentioned contents, no matter whether the single gate transistor structure or the floating gate transistor structure is used, implantation of the same type of ions can further be employed to increase the ion concentrations of the semiconductor substrate or the first ion doped region by 1-10 times.

According to one embodiment of the present invention, when the transistor structure of the present invention is an N-type transistor, the first ion doped region or the second ion doped region is an N-doped region, and the semiconductor substrate is a P-type semiconductor substrate, or a semiconductor substrate having a P-type well. Alternatively, when the aforementioned transistor structure is a P-type transistor, the first ion doped region or the second ion doped region is a P-doped region, and the semiconductor substrate is an N-type semiconductor substrate, or a semiconductor substrate having an N-type well.

Regarding each of the single gate transistor structure or floating gate transistor structure, different types of operating methods must be employed according to a variety of regions where the ions are implanted as well as types of the transistor structures.

In one embodiment, when the transistor is an N-type transistor structure and the-same-type ions are implanted into the first ion doped regions to increase the ion concentrations, the operating method of the present invention comprises steps of applying a gate voltage $V_g$, a source voltage $V_s$, a drain voltage $V_d$, and a substrate voltage $V_{subp}$ to the first electric-conduction gate or the floating gate, the source, the drain, and the semiconductor substrate, respectively, wherein following conditions are satisfied:

When a writing operation is performed on the N-type transistor structure, $V_{subp}$ is grounded (0V), $V_d$ is high voltage (HV), $V_s$ is floating, and $V_g$ is high voltage (HV), or alternatively, $V_{subp}$ is grounded (0V), $V_s$ is high voltage (HV), $V_d$ is floating, and $V_g$ is high voltage (HV).

When an erasing operation is performed on the N-type transistor structure, $V_{subp}$ is grounded (0V), $V_d$ is high voltage (HV), $V_s$ is floating, and $V_g$ is floating; or alternatively, $V_{subp}$ is grounded (0V), $V_s$ is high voltage (HV), $V_d$ is floating, and $V_g$ is floating.

In another embodiment, when the transistor is a P-type transistor structure, and the-same-type ions are implanted into the first ion doped regions to increase icon concentrations, the operating method of the present invention comprises steps of applying a gate voltage $V_g$, a source voltage $V_s$, a drain voltage $V_d$, and a substrate voltage $V_{subn}$ to the first electric-conduction gate or the floating gate, the source, the drain, and the semiconductor substrate, respectively, wherein the following conditions are satisfied:

When a writing operation is performed on the P-type transistor structure, $V_{subn}$ is high voltage (HV), $V_d$ is grounded (0V), $V_s$ is floating, and $V_g$ is grounded (0V), or alternatively, $V_{subn}$ is high voltage (HV), $V_s$ is grounded (0V), $V_d$ is floating, and $V_g$ is grounded (0V).

When an erasing operation is performed on the P-type transistor structure, $V_{subn}$ is high voltage (HV), $V_d$ is grounded, $V_s$ is floating, and $V_g$ is floating, or alternatively, $V_{subn}$ is high voltage (HV), $V_s$ is grounded, $V_d$ is floating, and $V_g$ is floating.

These and other objectives of the present invention will become obvious to those of ordinary skill in the art after reading the following detailed description of preferred embodiments.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION OF THE PREFERRED EMBODIMENTS

Reference will now be made in detail to the preferred embodiments of the present invention, examples of which are illustrated in the accompanying drawings. Wherever possible, the same reference numbers are used in the drawings and the description to refer to the same or like parts.

The embodiments described below are illustrated to demonstrate the technical contents and characteristics of the present invention and to enable the persons skilled in the art to understand, make, and use the present invention. However, it shall be noticed that, it is not intended to limit the scope of the present invention. Therefore, any equivalent modification or variation according to the spirit of the present invention is to be also included within the scope of the present invention.

The following embodiments of the present invention are herein described in detail with reference to the accompanying drawings. These drawings show specific examples of the embodiments of the present invention. These embodiments are provided so that this disclosure will be thorough and complete, and will fully convey the scope of the invention to those skilled in the art. It is to be acknowledged that these embodiments are exemplary implementations and are not to be construed as limiting the scope of the present invention in any way. Further modifications to the disclosed embodiments, as well as other embodiments, are also included within the scope of the appended claims. These embodiments are provided so that this disclosure is thorough and complete, and fully conveys the inventive concept to those skilled in the art. Regarding the drawings, the relative proportions and ratios of elements in the drawings may be exaggerated or diminished in size for the sake of clarity and convenience. Such arbitrary proportions are only illustrative and not limiting in any way. The same reference numbers are used in the drawings and description to refer to the same or like parts.

It is to be acknowledged that, although the terms 'first', 'second', 'third', and so on, may be used herein to describe various elements, these elements should not be limited by these terms. These terms are used only for the purpose of distinguishing one component from another component. Thus, a first element discussed herein could be termed a second element without altering the description of the present disclosure. As used herein, the term "or" includes any and all combinations of one or more of the associated listed items.

It will be acknowledged that when an element or layer is referred to as being "on," "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present.

In addition, unless explicitly described to the contrary, the word "comprise", "include" and "have", and variations such as "comprises", "comprising", "includes", "including", "has" and "having" will be acknowledged to imply the inclusion of stated elements but not the exclusion of any other elements.

The present invention provides an operating method of an EEPROM cell, and the operating method is applicable to the EEPROM cell. In such an EEPROM cell, ion implantation for increasing ion concentrations is employed to increase electric field between the gate and the transistor or between the gate and the substrate, so as to reduce a voltage difference in writing and erasing operations. The operating method of the present invention simultaneously applies operating voltages to the gate, the source and the drain, which are connected with a memory cell, and in the condition that the source or the drain is set as floating during operations to achieve the effects of rapid programming and erasing for a large number of memory cells.

Figure 1A:
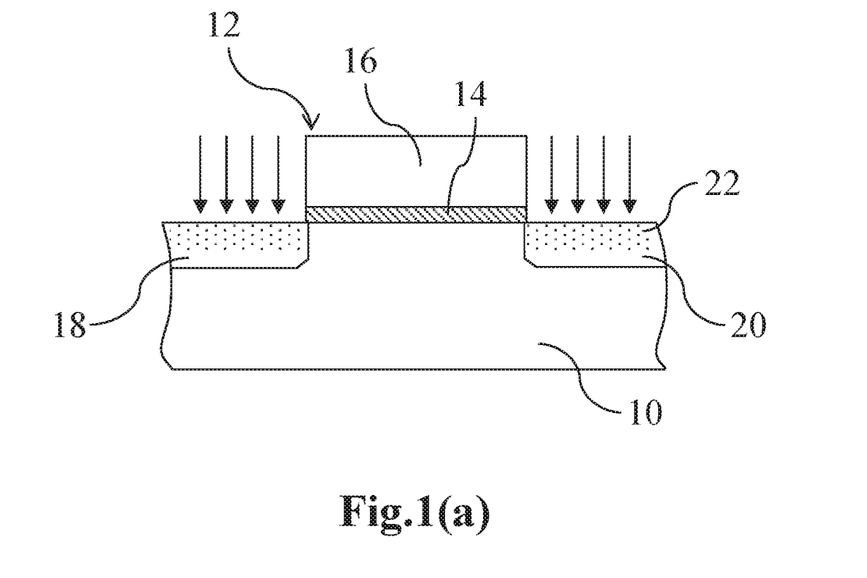
FIG. 1(a) shows a schematic structural view of an EEPROM cell, in which ions are implanted into first ion doped regions (the source and the drain) in accordance with one embodiment of the present invention.
Figure 1B:
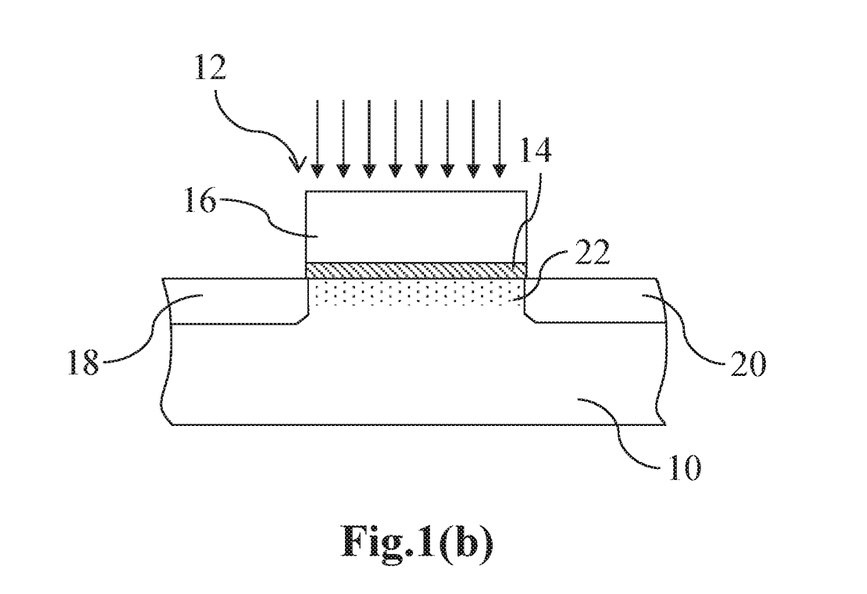
FIG. 1(b) shows a schematic structural view of an EEPROM cell, in which ions are implanted into a semiconductor substrate in accordance with another embodiment of the present invention.

Please refer to FIGS. 1(a) and 1(b), the EEPROM cell of the present invention comprises: a semiconductor substrate 10, and at least one transistor structure formed on the semiconductor substrate 10. The transistor structure 12 comprises a first dielectric layer 14 disposed on a surface of the semiconductor substrate 10, and a first electric-conduction gate 16 is disposed on the first dielectric layer 14. At least two first ion doped regions 18 and 20 are disposed in the semiconductor substrate 10 and respectively on two opposite sides of the first electric-conduction gate 16, for serving as a source 18 and a drain 20, respectively. The operating method of the present invention is proposed to apply the voltage difference between the source/drain and the gate, or the voltage difference between the substrate/well and the gate, to enable electrons to pass through the dielectric layer (oxide layer), so as to achieve low-current writing and erasing operations. According to the present invention, two manners for ion implantation for increasing ion concentrations are proposed. FIG. 1(a) shows a first manner, which uses the ion implantation manner to implant the-same-type ions 22, as the first ion doped regions 18 and 20, into the regions of the first ion doped regions 18 and 20, which are respectively at the interface of the source 18 and the first electric-conduction gate 16, and at the interface of the drain 20 and the first electric-conduction gate 16. It is meant by the same type of ions 22: when the first ion doped regions 18 and 20 are P type, P-type ions 22 are implanted; and when the first ion doped regions 18 and 20 are N type, N-type ions 22 are implanted. As such, ion concentrations of the first ion doped regions 18 and 20 are increased, so that the ion concentrations in the first ion doped regions 18 and 20 can be increased by one to ten times higher than its original concentration. As a result, the voltage difference between the transistor structure and the first electric-conduction gate can be applied so as to perform writing and erasing operations. And, by such, the voltage difference in the writing and erasing operations can be reduced. FIG. 1(b) shows the other manner, which uses the ion implantation manner to implant the-same-type ions 22, as that of the semiconductor substrate 10, into a region of the semiconductor substrate 10, which is between the interface of the source 18 and the first electric-conduction gate 16 and the interface of the drain 20 and the first electric-conduction gate 16. It is meant by the same type of ions 22: when the semiconductor substrate is P type, P-type ions 22 are implanted, and when the semiconductor substrate is N type, N-type ions 22 are implanted. As such, the ion concentrations; similarly, the ion concentrations in the semiconductor substrate 10 can be increased by one times to ten times higher than its original concentration. As a result, the voltage difference between the semiconductor substrate and the first electric-conduction gate can be applied so as to perform proceeding operations.

Furthermore, spacers (not shown in the drawings) are respectively formed on two side walls of the first dielectric layer and the first electric-conduction gate. The implantation of the same type of ions into the first ion doped regions, which are respectively at the interface of the source 18 and the first electric-conduction gate 16, and at the interface of the drain 20 and the first electric-conduction gate 16, is undertaken before the formation of the spacers. In one embodiment, each of the first ion doped regions 18 and 20 may further comprise a lightly doped drain (LDD). In such a case, LDD is the preferred doped region.

In addition to the aforementioned single gate structure, the two ion implantation manners for increasing concentrations disclosed in the present invention can also be applied to a single floating gate structure. The difference between these two applications is merely that, the single floating gate structure further comprises a capacitor structure having a second electric-conduction gate, which is electrically connected to the first electric-conduction gate for serving as a single floating gate structure. The various structural applications and operating methods will be fully described in the following paragraphs in details for references.

Figure 2:
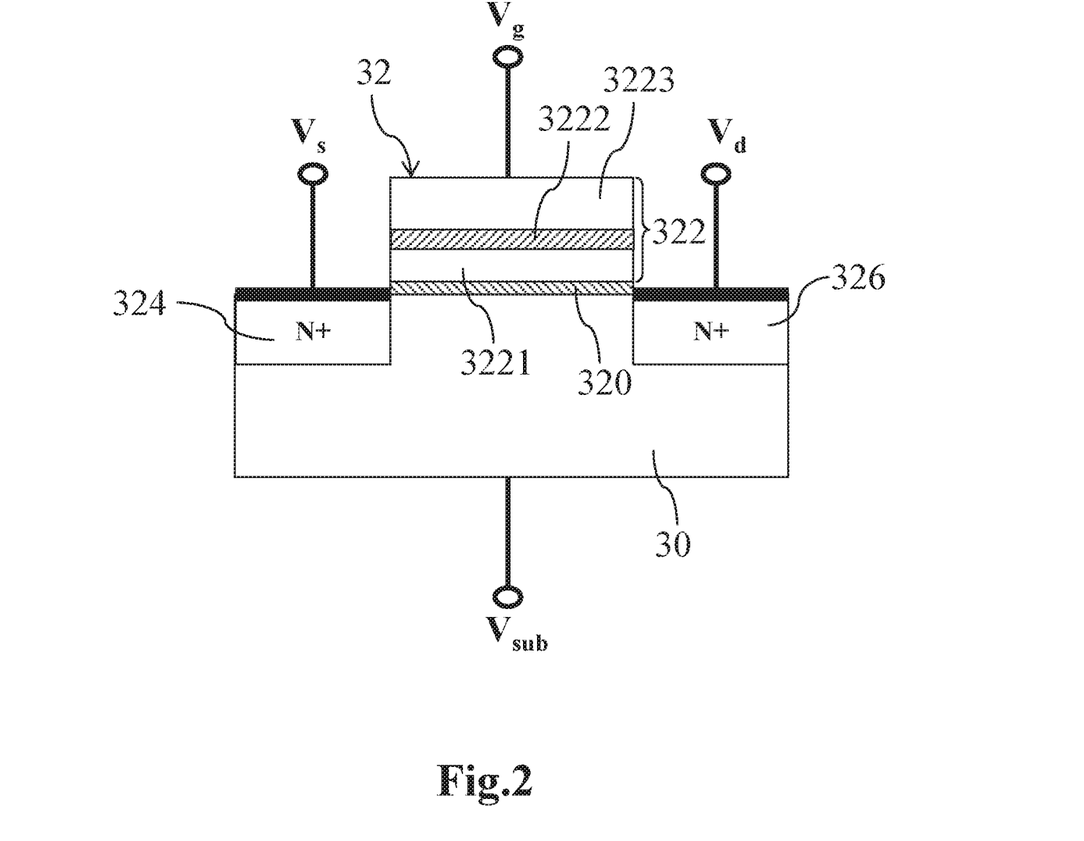
FIG. 2 shows a schematic diagram of a single memory cell with an N-type transistor as a single gate structure according to one embodiment of the present invention.

In the beginning, please refer to FIG. 2. The single memory cell structure of the EEPROM cell can comprise a P-type semiconductor substrate 30, or a semiconductor substrate having a P-type well. Hereinafter, the P-type semiconductor substrate 30 is taken as a first example for explanation. An N-type transistor 32 (such as a NMOSFET) is disposed on the P-type semiconductor substrate 30, and includes a first dielectric layer 320 disposed on a surface of the P-type semiconductor substrate 30, a first electric-conduction gate 322 stacked on the first dielectric layer 320, and two N-type ion doped regions disposed in the P-type semiconductor substrate 30, for serving as a source 324 and a drain 326, respectively. A channel is formed between the source 324 and the drain 326. The first electric-conduction gate 322 includes, from bottom to top in a sequential order, a floating gate 3221, a dielectric control layer 3222 and a control gate 3223 stacked on the first dielectric layer 320, so as to form the single gate structure.

Figure 3:
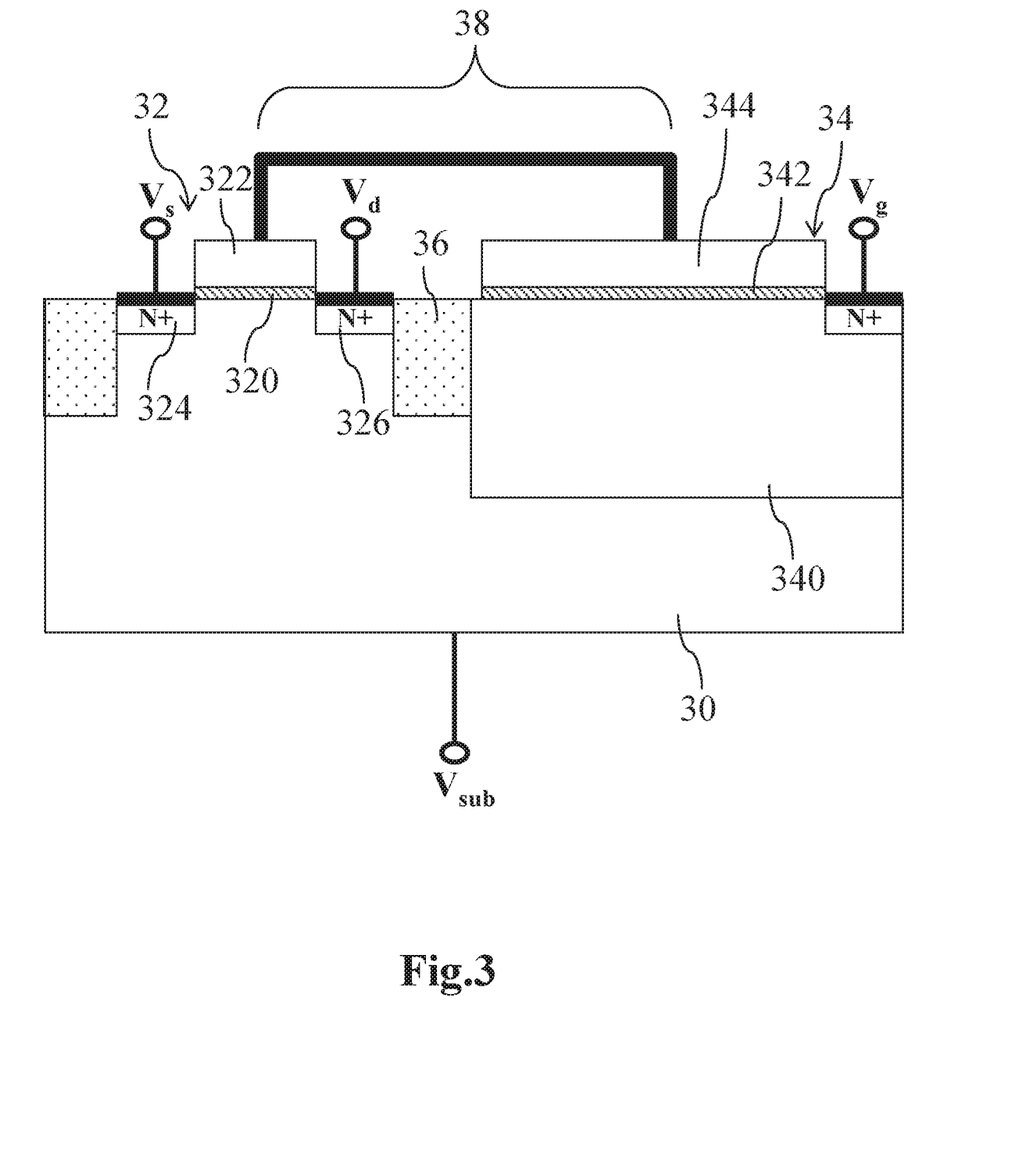
FIG. 3 shows a schematic diagram of a single memory cell with an N-type transistor as a single floating gate structure according to one embodiment of the present invention.

Next, please refer to FIG. 3. The single memory cell structure of the EEPROM cell may alternatively comprise a P-type semiconductor substrate 30, and an N-type transistor 32 and an N-well capacitor 34 are disposed on the P-type semiconductor substrate 30. The N-type transistor 32 and the N-well capacitor 34 are separated by a spacer 36. The N-type transistor 32 (such as a NMOSFET) comprises a first dielectric layer 320 disposed on a surface of the P-type semiconductor substrate 30, a first electric-conduction gate 322 stacked on the first dielectric layer 320, and two N-type ion doped regions disposed in the P-type semiconductor substrate 30 for serving as a source 324 and a drain 326, respectively. A channel is formed between the source 324 and the drain 326. The N-well capacitor 34 comprises a second ion doped region disposed in the P-type semiconductor substrate 30 for serving as an N-type well 340. A second dielectric layer 342 is disposed on a surface of the N-type well 340, and a second electric-conduction gate 344 is disposed on the second dielectric layer 342, so as to form a top plate-dielectric layer-bottom plate capacitor structure. The first electric-conduction gate 322 of the N-type transistor 32 and the second electric-conduction gate 344 of the N-well capacitor 34 are electrically connected to each other and separated by the spacer 36, to form the structure of a single floating gate 38.

Please refer to FIGS. 2 and 3 at the same time. No matter whether the memory cell structure shown in FIG. 2 or FIG. 3 is used, when the EEPROM cell comprises the N-type transistor 32 and the-same-N-type or P-type ions are implanted into the regions of the ion doped regions which are respectively near the interface of the source 324 and the first electric-conduction gate 322, and the interface of the drain 326 and the first electric-conduction gate 322 to increase the ion concentrations, for example, by one to ten times, the operating method of the present invention includes steps of applying a gate voltage $V_g$, a source voltage $V_s$, a drain voltage $V_d$, and a substrate voltage $V_{subp}$ to the first electric-conduction gate 322 (or the single floating gate 38), the source 324, the drain 326, and the P-type semiconductor substrate 30, respectively, and the following conditions are satisfied:

When a writing operation is performed on the N-type transistor 32, $V_{subp}$ is grounded (0V), $V_d$ is high voltage (HV), $V_s$ is floating, and $V_g$ is high voltage (HV), or alternatively, $V_{subp}$ is grounded (0V), $V_s$ is high voltage (HV), $V_d$ is floating, and $V_g$ is high voltage (HV).

When an erasing operation is performed on the N-type transistor 32, $V_{subp}$ is grounded (0V), $V_d$ is high voltage (HV), $V_s$ is floating, and $V_g$ is floating, or alternatively, $V_{subp}$ is grounded (0V), $V_s$ is high voltage (HV), $V_d$ is floating, and $V_g$ is floating.

Figure 4:
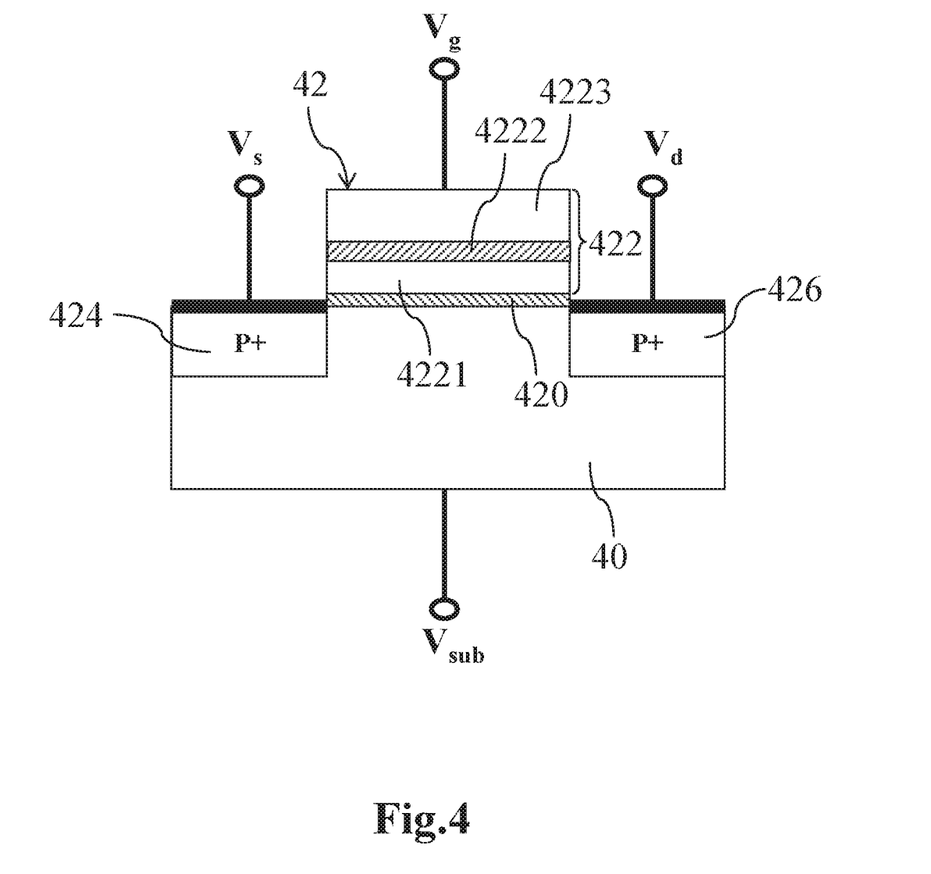
FIG. 4 shows a schematic diagram of a single memory cell with a P-type transistor as a single gate structure according to one embodiment of the present invention.

In another aspect, please refer to FIG. 4. The single memory cell structure of the EEPROM cell comprises a N-type semiconductor substrate 40 or a semiconductor substrate having a N-type well. Hereinafeter, the N-type semiconductor substrate 40 is taken as another example for illustration in following paragraphs. A P-type transistor 42 (such as a PMOSFET) is disposed on the N-type semiconductor substrate 40, and comprises a first dielectric layer 420 disposed on a surface of the N-type semiconductor substrate 40, a first electric-conduction gate 422 stacked on the first dielectric layer 420, and two P-type ion doped regions disposed in the N-type semiconductor substrate 40, for serving as a source 424 and a drain 426, respectively. A channel is formed between the source 424 and the drain 426. The first electric-conduction gate 422 includes, from bottom to top in a sequential order, a floating gate 4221, a dielectric control layer 4222, and a control gate 4223 stacked on the first dielectric layer 420, so as to form the single gate structure.

Figure 5:
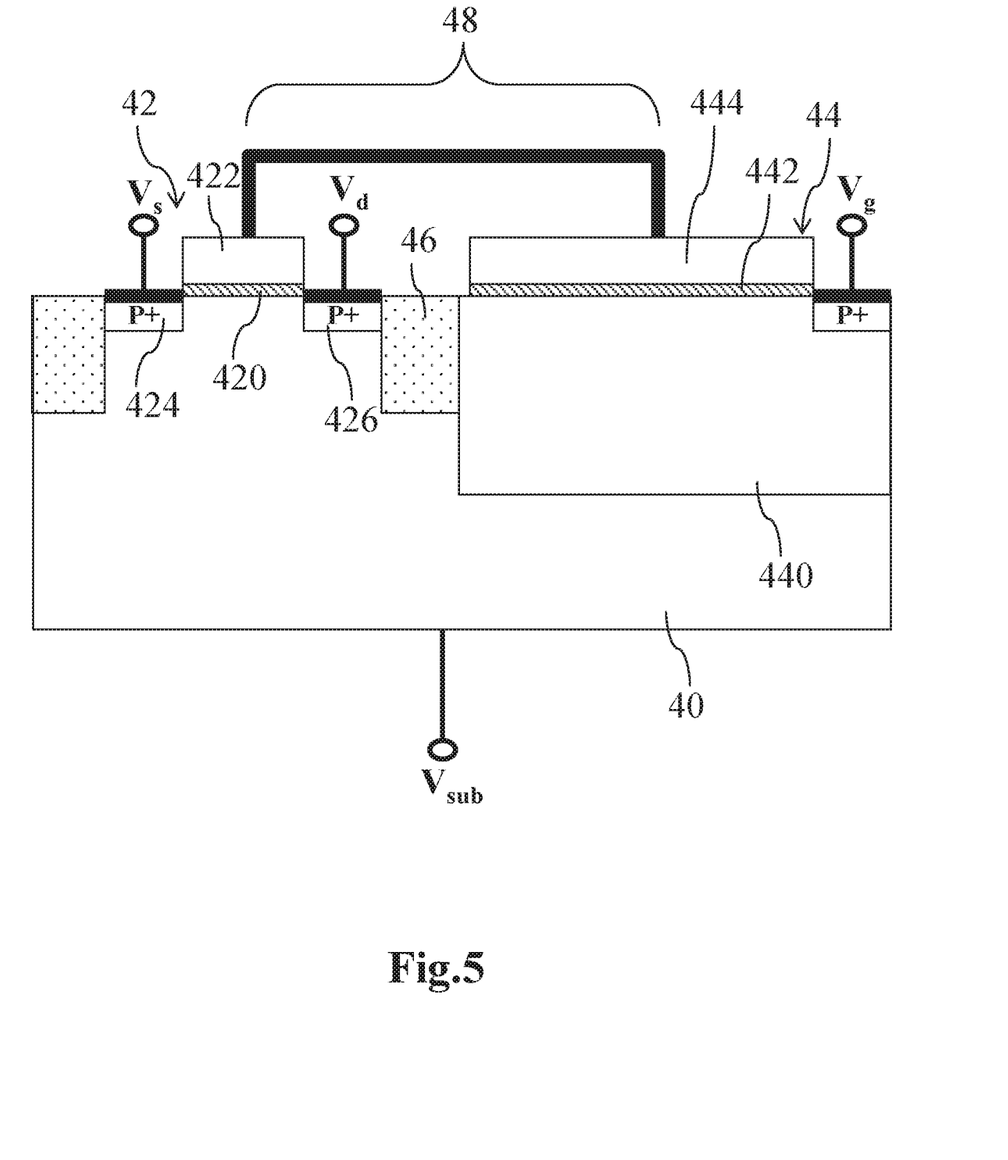
FIG. 5 shows a schematic diagram of a single memory cell with a P-type transistor as a single floating gate structure according to one embodiment of the present invention.

Next, as shown in FIG. 5, the single memory cell structure of the EEPROM cell may alternatively comprise an N-type semiconductor substrate 40, and a P-type transistor 42 and a P-well capacitor 44 are disposed on the N-type semiconductor substrate 40. The P-type transistor 42 and the P-well capacitor 44 are separated by a spacer 46. The P-type transistor 42 (such as a PMOSFET) comprises a first dielectric layer 420 disposed on a surface of the N-type semiconductor substrate 40, a first electric-conduction gate 422 stacked on the first dielectric layer 420, and two N-type ion doped regions disposed in the N-type semiconductor substrate 40 for serving as a source 424 and a drain 426, respectively. A channel is formed between the source 424 and the drain 426. The P-well capacitor 44 comprises a second ion doped region disposed in the N-type semiconductor substrate 40 for serving as a P-type well 440. A second dielectric layer 442 is disposed on a surface of the P-type well 440, and a second electric-conduction gate 444 is disposed on the second dielectric layer 442, so as to form the top plate-dielectric layer-bottom plate capacitor structure. The first electric-conduction gate 422 of the P-type transistor 42 and the second electric-conduction gate 444 of the P-well capacitor 44 are electrically connected to each other and separated from each other by the spacer 46, to form a structure of a single floating gate 48.

Please refer to FIGS. 4 and 5 at the same time. No matter whether the memory cell structure shown in FIG. 4 or FIG. 5 is used, when the EEPROM cell comprises the P-type transistor 42, and the-same-N-type or P-type ions are implanted into the regions of the ion doped regions which are respectively near the interface of the source 424 and the first electric-conduction gate 422, and the interface of the drain 426 and the first electric-conduction gate 422 to increase the ion concentrations, for example, by one to ten times, the operating method of the present invention includes steps of applying a gate voltage $V_g$, a source voltage $V_s$, a drain voltage $V_d$, and a substrate voltage $V_{subn}$ to the first electric-conduction gate 422 (or the single floating gate 48), the source 424, the drain 426 and the N-type semiconductor substrate 40, respectively, and the following operating conditions are satisfied:

When a writing operation is performed on the P-type transistor 42, $V_{subn}$ is high voltage (HV), $V_d$ is grounded (0V), $V_s$ is floating, and $V_g$ is grounded (0V), or alternatively, $V_{subn}$ is high voltage (HV), $V_s$ is grounded (0V), $V_d$ is floating, and $V_g$ is grounded (0V).

When an erasing operation is performed on the P-type transistor 42, $V_{subn}$ is high voltage (HV), $V_d$ is grounded (0V), $V_s$ is floating, and $V_g$ is floating, or alternatively, $V_{subn}$ is high voltage (HV), $V_s$ is grounded (0V), $V_d$ is floating, and $V_g$ is floating.

As a result, according to the EEPROM cell disclosed by the present invention, since the data writing and erasing operations are correlate with the doping concentration, which influences the voltages-needed to be applied to the source, the drain and the gate, the data writing and erasing operations can be enabled as long as sufficient voltage differences can be applied to the source, the drain and the gate. Therefore, the high voltage required in the conventional technology can be reduced through replacing the grounding with a negative voltage. For such a memory architecture that low-voltage operations can be realized, the present invention particularly proposes that the source or the drain can be set to a floating condition during data writing and erasing operations, so that the writing and erasing operations of the memory cell is believed to be much more simple and efficient than ever.

Therefore, to sum up, it is believed that the present invention is instinct, effective and highly competitive for recent technology and industries in the market nowadays, whereby having extraordinary availability and competitiveness for future industrial developments and being in condition for early allowance.

It will be apparent to those skilled in the art that various modifications and variations can be made to the present invention without departing from the scope or spirit of the invention. In view of the foregoing, it is intended that the present invention cover modifications and variations of this invention provided they fall within the scope of the invention and its equivalent.

What is claimed is:

1. An operating method of an electrically erasable programmable read only memory (EEPROM) cell, wherein the EEPROM cell comprises a semiconductor substrate and at least one N-type transistor structure disposed on the semiconductor substrate, the N-type transistor structure comprises a first electric-conduction gate and at least two first ion doped regions disposed in the semiconductor substrate and on two opposite sides of the first electric-conduction gate for serving as a source and a drain, respectively, the-same-type ions, as that of the first ion doped regions, are implanted into regions of the first ion doped regions, which are respectively at an interface of the source and the first electric-conduction gate, and at an interface of the drain and the first electric-conduction gate, to increase ion concentrations, and the operating method comprises:

applying a gate voltage $V_g$, a source voltage $V_s$, a drain voltage $V_d$, and a substrate voltage $V_{subp}$ to the first electric-conduction gate, the source, the drain, and the semiconductor substrate, respectively, wherein following conditions are satisfied:

when a writing operation is performed on the N-type transistor structure, the substrate voltage $V_{subp}$ is grounded (0V), the drain voltage $V_d$ is high voltage (HV), the source voltage $V_s$ is floating, and the gate voltage $V_g$ is high voltage (HV), or the substrate voltage $V_{subp}$ is grounded (0V), the source voltage $V_s$ is high voltage (HV), the drain voltage $V_d$ is floating, and the gate voltage $V_g$ is high voltage (HV); and when an erasing operation is performed on the N-type transistor structure, the substrate voltage $V_{subp}$ is grounded (0V), the drain voltage $V_d$ is high voltage (HV), the source voltage $V_s$ is floating, and the gate voltage $V_g$ is floating, or alternatively, the substrate voltage $V_{subp}$ is grounded (0V), the source voltage $V_s$ is high voltage (HV), the drain voltage $V_d$ is floating, and the gate voltage $V_g$ is floating.

2. The operating method according to claim 1, wherein the EEPROM cell further comprises a capacitor structure disposed on a surface of the semiconductor substrate and separated from the N-type transistor structure, the capacitor structure comprises a second ion doped region disposed in the semiconductor substrate, and a second electric-conduction gate electrically connected to the first electric-conduction gate for serving as a single floating gate, and the gate voltage $V_g$ is applied to the single floating gate.

3. The operating method according to claim 1, wherein the-same-type ions are implanted to increase the ion concentrations of the semiconductor substrate or the first ion doped regions by one to ten times.

4. The operating method according to claim 1, wherein the N-type transistor structure is an NMOSFET.

5. The operating method according to claim 1, wherein each of the at least two first ion doped regions further comprises a lightly-doped drain.

6. An operating method of an electrically erasable programmable read only memory (EEPROM) cell, wherein the EEPROM cell comprises a semiconductor substrate and at least one P-type transistor structure disposed on the semiconductor substrate, the at least one P-type transistor structure comprises a first electric-conduction gate and at least two first ion doped regions disposed in the semiconductor substrate and on two opposite sides of the first electric-conduction gate for serving as a source and a drain, respectively, the-same-type ions, as that of the first ion doped regions, are implanted into regions of the first ion doped regions, which are respectively at an interface of the source and the first electric-conduction gate, and at an interface of the drain and the first electric-conduction gate to increase ion concentrations, and the operating method comprises:

applying a gate voltage $V_g$, a source voltage $V_s$, a drain voltage $V_d$, and a substrate voltage $V_{subn}$ to the first electric-conduction gate, the source, the drain, and the semiconductor substrate, respectively, wherein the following conditions are satisfied:

when a writing operation is performed on the P-type transistor structure, the substrate voltage $V_{subn}$ is high voltage (HV), the drain voltage $V_d$ is grounded, the source voltage $V_s$ is floating, and the gate voltage $V_g$ is grounded, or alternatively, the substrate voltage $V_{subn}$ is high voltage (HV), the source voltage $V_s$ is grounded, the drain voltage $V_d$ is floating, and the gate voltage $V_g$ is grounded; and when an erasing operation is performed on the P-type transistor structure, the substrate voltage $V_{subn}$ is high voltage (HV), the drain voltage $V_d$ is grounded, the source voltage $V_s$ is floating, and the gate voltage $V_g$ is floating, or alternatively, the substrate voltage $V_{subn}$ is high voltage (HV), the source voltage $V_s$ is grounded, the drain voltage $V_d$ is floating, and the gate voltage $V_g$ is floating.

7. The operating method according to claim 6, wherein the EEPROM cell further comprises a capacitor structure disposed on a surface of the semiconductor substrate and separated from the P-type transistor structure, the capacitor structure comprises a second ion doped region disposed in the semiconductor substrate, and a second electric-conduction gate electrically connected to the first electric-conduction gate for serving as a single floating gate, and the gate voltage $V_g$ is applied to the single floating gate.

8. The operating method according to claim 6, wherein the-same-type ions are implanted to increase the ion concentrations of the semiconductor substrate or the first ion doped regions by one to ten times.

9. The operating method according to claim 6, wherein the P-type transistor structure is a PMOSFET.

10. The operating method according to claim 6, wherein each of the at least two first ion doped regions further comprises a lightly-doped drain.

11. An operating method of an electrically erasable programmable read only memory (EEPROM) cell, wherein the EEPROM cell comprises a semiconductor substrate and at least one transistor structure disposed on the semiconductor substrate, the at least one transistor structure comprises a first electric-conduction gate and at least two first ion doped regions disposed in the semiconductor substrate and on two opposite sides of the first electric-conduction gate for serving as a source and a drain, respectively, the-same-type ion, as that of the semiconductor substrate, is implanted into a region of the semiconductor substrate, which is between an interface of the source and the first electric-conduction gate and an interface of the drain and the first electric-conduction gate, to increase ion concentrations, and the operating method comprises:

applying a gate voltage $V_g$, a source voltage $V_s$, a drain voltage $V_d$, and a substrate voltage $V_{sub}$, to the first electric-conduction gate, the source, the drain, and the semiconductor substrate, respectively, wherein the following conditions are satisfied:

when the transistor structure is an N-type transistor structure:

when a writing operation is performed on the N-type transistor structure, the substrate voltage $V_{sub}$ is grounded (0V), the drain voltage $V_d$ is high voltage (HV), the source voltage $V_s$ is floating, and the gate voltage $V_g$ is high voltage (HV), or alternatively, the substrate voltage $V_{sub}$ is grounded (0V), the source voltage $V_s$ is high voltage (HV), the drain voltage $V_d$ is floating, and the gate voltage $V_g$ is high voltage (HV); and when an erasing operation is performed on the N-type transistor structure, the substrate voltage $V_{sub}$ is grounded (0V), the drain voltage $V_d$ is high voltage (HV), the source voltage $V_s$ is floating, and the gate voltage $V_g$ is floating, or alternatively, the substrate voltage $V_{sub}$ is grounded (0V), the source voltage $V_s$ is high voltage (HV), the drain voltage $V_d$ is floating, and the gate voltage $V_g$ is floating; or when the transistor structure is a P-type transistor structure, when a writing operation is performed on the P-type transistor structure, the substrate voltage $V_{sub}$ is high voltage (HV), the drain voltage $V_d$ is grounded, the source voltage $V_s$ is floating, and the gate voltage $V_g$ is grounded, or alternatively, the substrate voltage $V_{sub}$ is high voltage (HV), the source voltage $V_s$ is grounded, the drain voltage $V_d$ is floating, and the gate voltage $V_g$ is grounded; and when an erasing operation is performed on the P-type transistor structure, the substrate voltage $V_{sub}$ is high voltage (HV), the drain voltage $V_d$ is grounded, the source voltage $V_s$ is floating, and the gate voltage $V_g$ is floating, or alternatively, the substrate voltage $V_{sub}$ is high voltage (HV), the source voltage $V_s$ is grounded, the drain voltage $V_d$ is floating, and the gate voltage $V_g$ is floating.

12. The operating method according to claim 11, wherein the EEPROM cell further comprises a capacitor structure disposed on a surface of the semiconductor substrate and separated from the transistor structure, the capacitor structure comprises a second ion doped region disposed in the semiconductor substrate and a second electric-conduction gate electrically connected to the first electric-conduction gate for serving as a single floating gate, and the gate voltage $V_g$ is applied to the single floating gate.

13. The operating method according to claim 12, wherein when the transistor structure is the N-type transistor structure, the at least two first ion doped regions and the second ion doped region are N-doped regions, and the semiconductor substrate is a P-type semiconductor substrate, or a semiconductor substrate having a P-type well; and when the transistor structure is the P-type transistor structure, the at least two first ion doped regions and the second ion doped region are P-doped regions, and the semiconductor substrate is an N-type semiconductor substrate, or a semiconductor substrate having an N-type well.

14. The operating method according to claim 11, wherein when the transistor structure is the N-type transistor structure, the at least two first ion doped regions are N-doped regions, and the semiconductor substrate is a P-type semiconductor substrate, or a semiconductor substrate having a P-type well; and when the transistor structure is the P-type transistor structure, the at least two first ion doped region are P-doped regions, and the semiconductor substrate is an N-type semiconductor substrate, or a semiconductor substrate having an N-type well.

15. The operating method according to claim 11, wherein the-same-type ions are implanted to increase the ion concentrations of the semiconductor substrate or the at least two first ion doped regions by one to ten times.

16. The operating method according to claim 11, wherein the transistor structure is a MOSFET.

17. The operating method according to claim 11, wherein each of the at least two first ion doped regions further comprises a lightly-doped drain.

* * * * *